United States Patent [19]

Kimura et al.

[11] Patent Number: 5,441,926
[45] Date of Patent: Aug. 15, 1995

[54] SUPERCONDUCTING DEVICE STRUCTURE WITH PR-BA-CU-O BARRIER LAYER

[75] Inventors: Hiroshi Kimura; Toshiyuki Matsui, both of Tokyo; Takeshi Suzuki, Zushi; Kazuo Mukae; Akihiko Ohi, both of Yokosuka, all of Japan

[73] Assignee: Fuji Electric Co., Ltd., Japan

[21] Appl. No.: 151,024

[22] Filed: Nov. 12, 1993

[30] Foreign Application Priority Data

Dec. 29, 1992 [JP] Japan .................................. 4-362126

[51] Int. Cl.$^6$ ....................... H01L 39/22; B05D 5/12; H01B 12/00
[52] U.S. Cl. ..................................... 505/193; 257/35; 257/36; 257/39; 505/234; 505/237; 505/238; 505/239; 427/62; 427/63
[58] Field of Search ............... 505/110, 191, 193, 329, 505/700–703, 779; 257/33–39, 661–663

[56] References Cited

U.S. PATENT DOCUMENTS 5,087,605  2/1992  Hegde et al. ..................... 257/661
5,250,506  10/1993  Saitoh et al. ..................... 505/191

FOREIGN PATENT DOCUMENTS 60-10792  1/1985  Japan .
63-224375  9/1988  Japan .

OTHER PUBLICATIONS

Mannhart et al, "Electric Field Effect on Superconducting YBaCuO Films," Z. Phys. B–Condensed Matter 83, 1991 pp. 307–311.
Superconductive Electroincs, J. IEEE Japan, vol. 108, No. 10, 1988 by Hisao Hayakawa.

Primary Examiner—Robert P. Limanek
Assistant Examiner—Mahshid Saadat
Attorney, Agent, or Firm—Parkhurst, Wendel & Rossi

[57] ABSTRACT

A superconducting transistor having a source region and a drain region are formed by a YBCO film on a barrier layer, which is composed of a PBCO film formed on an STO substrate. A gate electrode is disposed on the thinner wall at the back of the STO substrate. In a superconducting transistor so constructed the electric field created by the gate voltage works effectively at an interface with the barrier layer, more carriers can be drawn out relative to the applied gate voltage, and it becomes possible for a large superconduction current to flow.

8 Claims, 5 Drawing Sheets

SUPERCONDUCTING DEVICE STRUCTURE WITH PR-BA-CU-O BARRIER LAYER

FIELD OF THE INVENTION

The present invention relates to a superconducting device, and more particularly to a voltage-driven superconducting device that uses an oxide high-temperature superconductor.

BACKGROUND OF THE INVENTION

Practical application of the superconducting phenomenon has long been sought because it offers the following characteristics: it reduces electric resistance to zero, and it exhibits diamagnetism, which can help to greatly reduce electric power loss. Previously, it was believed that the superconduction phenomenon could only take place under cryogenic conditions. However, following the developments of new superconductors made using intermetallic compounds, the critical temperature, which is treated as a parameter of the practical application of the superconduction phenomenon (the boundary temperature between normal conduction and superconduction at which electric resistance drops substantially) has risen from year to year, and the superconduction phenomenon can now occur at normal temperatures.

A great deal is expected from the practical application of this superconduction phenomenon in the semiconductor device field as well, and there have been several proposals for high-speed, low-power-consumption superconducting transistors capable of realizing low power loss. Of these types of transistors, a voltage-driven superconducting transistor has drawn the most attention because of the ease with which it can be driven due to its large input impedance and its diminished input loss.

FIG. 5 shows a cross section illustrating the structure of a conventional voltage-driven superconducting transistor. This figure reveals that the superconducting transistor uses monocrystals of silicon as a substrate 14, on which an n-type semiconductor region 15 is formed by using arsenic ions. This semiconductor region 15 is connected to a source 11 and a drain 12, which act as superconducting electrodes, and a gate 13 insulated by a gate oxide film 18 is disposed between the source 11 and the drain 12, the gate 13 being covered by a side-insulating film 17 and an overhang 16. For example, source 11 and drain 12 are formed by niobium (Nb), the gate 13 is formed by polycrystalline silicon, the overhang 16 and the side-insulating film 17 are formed by $Si_3N_4$, and the gate oxide film 18 is formed by $SiO_2$.

In a superconducting transistor with such a configuration, Cooper pairs exude from the source 11 and the drain 12 as much as a coherence length, which is modulated by voltage applied to the gate 13 in order to link the source 11 with the drain 12 using the Cooper pairs. Since the coherence length is several dozens of nm (e.g., 24) in conventional superconductors, a superconducting transistor with the above configuration requires the distance between the gate 13 and the drain 12 to be reduced to about 0.1 μm.

In addition to the voltage-driven superconducting transistors using superconductors, current-injected superconducting transistors have also been proposed. However, due to current injection, these transistors suffer from problems such as heat generation and small current gain, and there have been no reports claiming the realization of good characteristics.

Because conventional voltage-driven superconducting transistors have a short coherence length as described above, it has been necessary to reduce the gate length (the distance between the source and the drain) to 0.1 μm or less. The relation between the coherence length λ and a superconduction gap φ in a voltage-driven superconducting transistor may be expressed approximately by the following formula (1) according to the BCS theory:

$$\lambda \infty \ (1/\phi) \tag{1}$$

Since the above superconduction gap φ is proportional to the critical temperature ($T_c$) of a superconductor, the coherence length λ becomes shorter as the critical temperature ($T_c$) rises. Therefore, in a superconducting transistor that utilizes oxides for the superconductor, the coherence length λ of the oxide superconductor with a critical temperature ($T_c$) of 40K or higher is several nm or less, which means that the gate length must be reduced further. It is extremely difficult to manufacture a device with such a short gate length, and the increased proximity of the source and the drain causes the element withstand voltage to decreases, which creates a problem.

Accordingly, in order to solve these problems, the applicant has proposed a superconducting element with a structure as shown in FIG. 6. The superconducting transistor shown in FIG. 6 (a) uses $SrTiO_3$ (hereinafter abbreviated as STO) as a substrate 1, on which a barrier layer 3 composed of $PrBa_2Cu_3O_{7-x}$ (hereinafter abbreviated as PBCO) is formed.

Subsequently, an oxide superconductor, $YBa_2Cu_3O_{7-x}$ (hereinafter abbreviated as YBCO) is formed on the barrier layer 3, and then a gap 4 on the order of submicrons is formed and used as a source region 2a and drain region 2b. In addition, a gate electrode 6 composed of an STO film is formed on the gap 4 via an insulation layer 5. Furthermore, a source electrode 7 on the surface of the source region 2a is made of Au, and a drain electrode 8 made of Au is also formed on the surface of the drain region 2b.

A superconducting transistor with such a configuration resolves the restriction in the gate length from the coherence length allowing the realization of a superconducting transistor that has a large distance between the source and the drain, as well as excellent withstand voltage, by using a PBCO film as the barrier layer 3, which connects the source region 2a to the drain region 2b. The PBCO film has a construction similar to the crystalline structure of a YBCO film, an oxide superconductor. In other words, a superconducting transistor with this configuration has a source drain 2a that is connected to the drain region 2b where the superconducting current flows due to carriers accumulated at the interface of the barrier layer 3, which corresponds to the gap 4 between the source region 2a) and the drain region 2b. The carriers are injected from the YBCO film into the PBCO film, which becomes semiconductive because of its low carrier concentration even though it has a crystalline structure similar to that of the YBCO film.

However, in the above-described superconducting transistor, the lines of electric force (g) in the vicinity of the YBCO film (the source region 2a and the drain region 2b) among the lines of electric force (g) due to the gate voltage are not irradiated vertically from the gate electrode 6, but rather are attracted to the sides of the YBCO film, which has an equipotential surface, as shown in FIG. 6 (b). This causes the electric fields on the source region 2a side and the drain region 2b side to decrease in the interface on the barrier layer 3 corresponding to the gap 4 between the source region 2a and the drain region 2b, and this decrease, in turn, causes the carriers attracted to these portions to decrease, making it difficult to bond the source region 2a and the drain region 2b smoothly. Therefore, in order to have the superconduction current flow between the source and the drain, it is necessary to apply a gate voltage that is sufficiently large to account for the loss in the lines of electric force (g) that are absorbed into the YBCO film, thereby creating a problem in that the current gain becomes smaller relative to the voltage between the source and the drain, as well as the gate voltage.

Therefore, given the above problems, the present invention is intended to provide a superconducting transistor (a superconducting device) that has excellent current output characteristics and can uniformly draw out the carriers relative to the gate voltage onto the interface of the barrier layer without disturbing the lines of electric force (the electric field) created by the gate voltage.

SUMMARY OF THE INVENTION

A first means offered by the present invention to solve the above problems is to fabricate a superconducting device comprising a source region and a drain region consisting of an oxide superconductor, a barrier layer with a crystalline structure similar to that of an oxide superconductor, and a gate electrode spanning over the source region and the drain region, said gate electrode being capable of applying an electric field to the barrier layer, by forming the source region and the drain region on the upper layer of the barrier layer, while forming the gate electrode below the lower layer of the barrier layer via an insulation layer. In this construction, it is preferable to form the gate electrode on the back of an insulating substrate as the insulation layer, although it is even more preferable to form it on the thinner wall of said substrate. Furthermore, a construction may be adopted wherein a semiconductor substrate is interposed between the insulation layer and the gate electrode.

A second means that may be applied to solve the above problems is to fabricate a superconducting element comprising a source region and a drain region consisting of an oxide superconductor, a barrier layer with a crystalline structure similar to that of an oxide superconductor, and a gate electrode spanning over the source region and the drain region, said gate electrode being capable of applying an electric field to the barrier layer, wherein the source region and the drain region have a laminar structure such that they sandwich the barrier layer, while the gate electrode faces one side extending over the source region, the insulation layer and the drain region.

The superconducting device according to the present invention provided with the above first means is characterized in that the source region and the drain region are formed on the upper layer of the barrier layer, while the gate electrode is formed below the lower layer of the barrier layer. Therefore, in a superconducting device according to the present invention, a parallel flat capacitor is constructed by the barrier layer and the gate electrode, making it possible to apply an electric field to the interface of the barrier layer relative to the gate voltage because the lines of electric force from the gate electrode are applied uniformly and effectively to the interface of the barrier layer without being applied directly to the sides of the source region and the drain region.

An electric charge (Q) stored in the parallel flat capacitor is expressed by the following formula (2):

$$Q = c \times v \qquad (2)$$

where C is the capacity of the capacitor and V is the potential.

The capacity (c) of the parallel flat capacitor is expressed by the following formula (3):

$$c = \epsilon \times s/d \qquad (3)$$

where $\epsilon$ is the inductivity, S the area of the capacitor flat plate, and d the distance to the flat plate.

From the above formulas (2) and (3), $$Q = \epsilon \times S \times V/d \qquad (4).$$

Therefore, from the formula (4), amount of electric charge "q" stored in a unit area can be expressed by the following formula (5):

$$q = Q/s = \epsilon \times V/d = \epsilon \times E \qquad (5)$$

where E is the size of the electric field. Thus, the amount of electric charge "q" stored in a unit area is proportional to the size of the applied electric field E.

In the present invention, a parallel flat capacitor includes the barrier layer and gate electrode described above, and an electric field corresponding to the gate voltage can be applied uniformly to the interface of the barrier layer over the source region and drain region. Therefore, because the amount of electric charge in the interface of the barrier layer increases uniformly over the area from the source region to the drain region and relative to the gate voltage, a large number of carriers (quasi-particles) are accumulated in this area, connecting the source region to the drain region and allowing a superconduction current flow between the source and drain. Thus, since the superconducting device according to the present invention can have an electric field that is formed by the gate voltage to be applied uniformly over the interface of the barrier layer, the carriers can be drawn out effectively to the interface of the barrier layer. In other words, because the carriers are accumulated uniformly on the interface of the barrier layer over the area from the source region to the drain region without carriers accumulated in bias due to variation in the electric field, it is possible to connect the source with the drain using a low gate voltage, save power on the gate voltage, and obtain a good current output with a diminished voltage loss. Therefore, a larger source-to-drain current (superconduction current) can be obtained than is possible in conventional devices using the same gate voltage.

If the gate electrode is formed on the back of the insulating substrate, this substrate may be used as a substitute for the insulation layer. Furthermore, if the gate electrode is formed on the thinner wall formed on the back of the substrate, the distance between the barrier layer (the interface of the barrier layer) is reduced, which serves to increase the electric charge in the interface of the barrier layer and draw out the carriers more effectively, thereby making it possible to improve the current output characteristics.

On the other hand, the superconducting device according to the present invention to which the second means is applied is characterized in that the source region and the drain region have a laminar structure such that they sandwich the barrier layer, while the gate electrode faces one side extending over the source region, the barrier layer and the drain region via the insulation layer. Therefore, the electric field due to the gate voltage is applied to the side extending over the source region, the barrier layer, and the drain region, where a large number of carriers is accumulated uniformly in accordance with the rise in the gate voltage. Accordingly, the source region is connected to the drain region, thereby making it possible to obtain a superconduction current corresponding to the gate voltage between the source and the drain.

DETAILED DESCRIPTION OF THE DRAWINGS

DETAILED DESCRIPTION OF THE PREFERRED EMBODIMENTS

Figure 1:
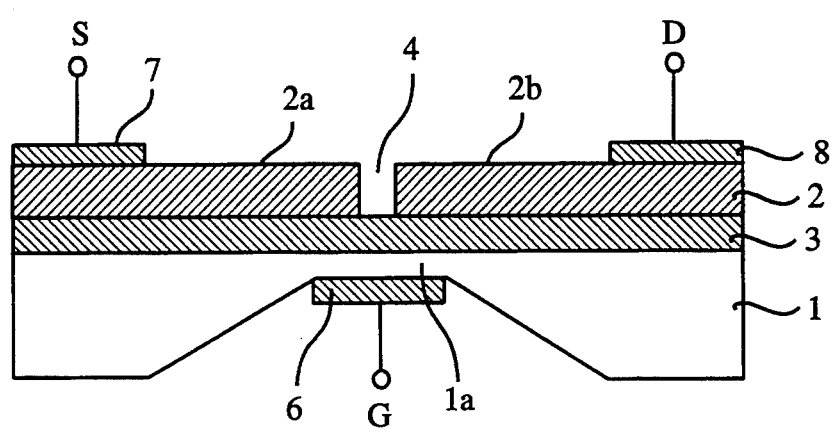
FIG. 1 is a cross section showing the structure of a superconducting transistor according to the first embodiment of the present invention.
Figure 6A:
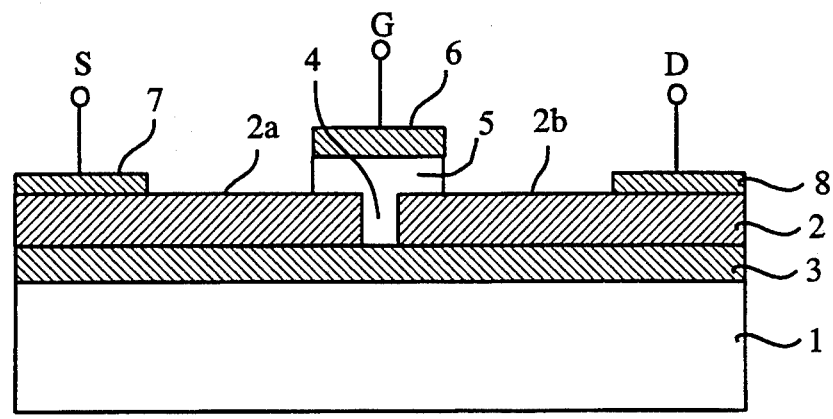
FIG. 6 (a) is a cross section showing the structure of a conventional superconducting transistor, and FIG. 6 (b) is an expanded illustration of a part of the transistor.
Figure 6B:
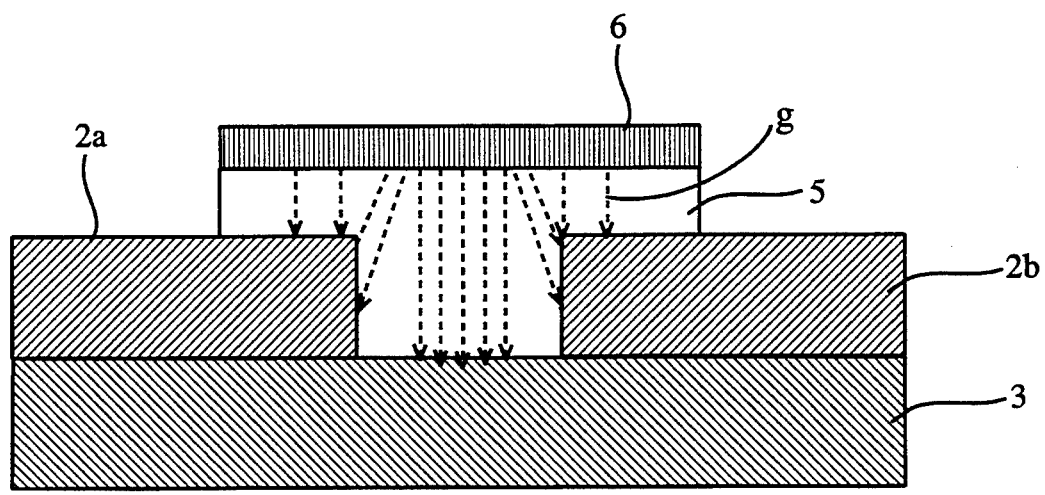

FIG. 1 is a cross section showing the structure of a superconducting transistor (superconducting device) according to the first embodiment of the present invention. In the superconducting transistor shown in FIG. 1, the parts corresponding to those that were previously explained with reference to FIG. 6 are given the same numerals.

In the figure, a superconducting transistor according to this embodiment uses $SrTiO_3$ with plane azimuth of (100) (hereinafter abbreviated as STO (100)) as the substrate 1, on which a barrier layer 3 composed of $PrBa_2Cu_3O_{7-x}$ (herein abbreviated as PBCO) is formed. On the surface of the barrier layer 3, a thin film 2 composed of $YBa_2Cu_3O_{7-x}$ (herein abbreviated as YBCO), an oxide high-temperature superconductor, is formed, this YBCO film 2 being divided by a gap 4 reaching up to the barrier layer 3 from the surface to the source region 2a to which a source electrode 7 is conductively connected and the drain region 2b to which a drain electrode 8 is connected. On the other hand, the back of the substrate 1 has a thinner wall 1a formed by a dimple grinder prior to formation of the barrier layer 3 and YBCO film 2, the thinner wall part 1a being disposed with a gate electrode 6.

The PBCO film, which makes up the barrier layer 3, resembles the YBCO film 2, which has a crystalline structure made up of an oxide superconductor. That is, since $PrBa_2Cu_3O_{7-x}$ (PBCO) is a compound with yttrium (Y) in $YBa_2Cu_3O_{7-x}$ (YBCO) displaced with praseodymium (Pr), the crystalline structure of the PBCO film has a $CuO_2$ plane as does the YBCO film 2, and adopts a perovskite structure. However, because of its insufficient carrier concentration (Hall concentration or electron concentration), the PBCO film does not create a superconduction phenomenon, but rather remains a semiconductor. In the superconducting transistor of this embodiment, the PBCO film and the YBCO film 2 both have a "c" axial orientation.

A noteworthy point of the superconducting transistor according to this embodiment, constructed as described above, is that the gate electrode 6 is disposed on the back of the substrate 1. This arrangement creates a parallel flat capacitor by including a gate electrode 6 and an interface on the YBCO film 2 side of the barrier layer 3 corresponding to the gate electrode 6, said capacitor storing an electric charge corresponding to the source-to-drain voltage and the gate voltage. As a result, an electric field corresponding to the gate voltage is applied uniformly to the interface on the barrier layer 3 over an area from the source region 2a to the drain region 2b corresponding to the gap 4, and carriers (quasi-particles) injected from the source region 2a and the drain region 2b are stored in a homogeneous manner from the source region 2a to the drain region 2b. This causes the carrier-storage region on the barrier layer 3 to turn into a local superconductor (passage for the superconduction current), the source region 2a being connected to the drain region 2b and the superconduction current flowing between the source and the drain.

Figure 2:
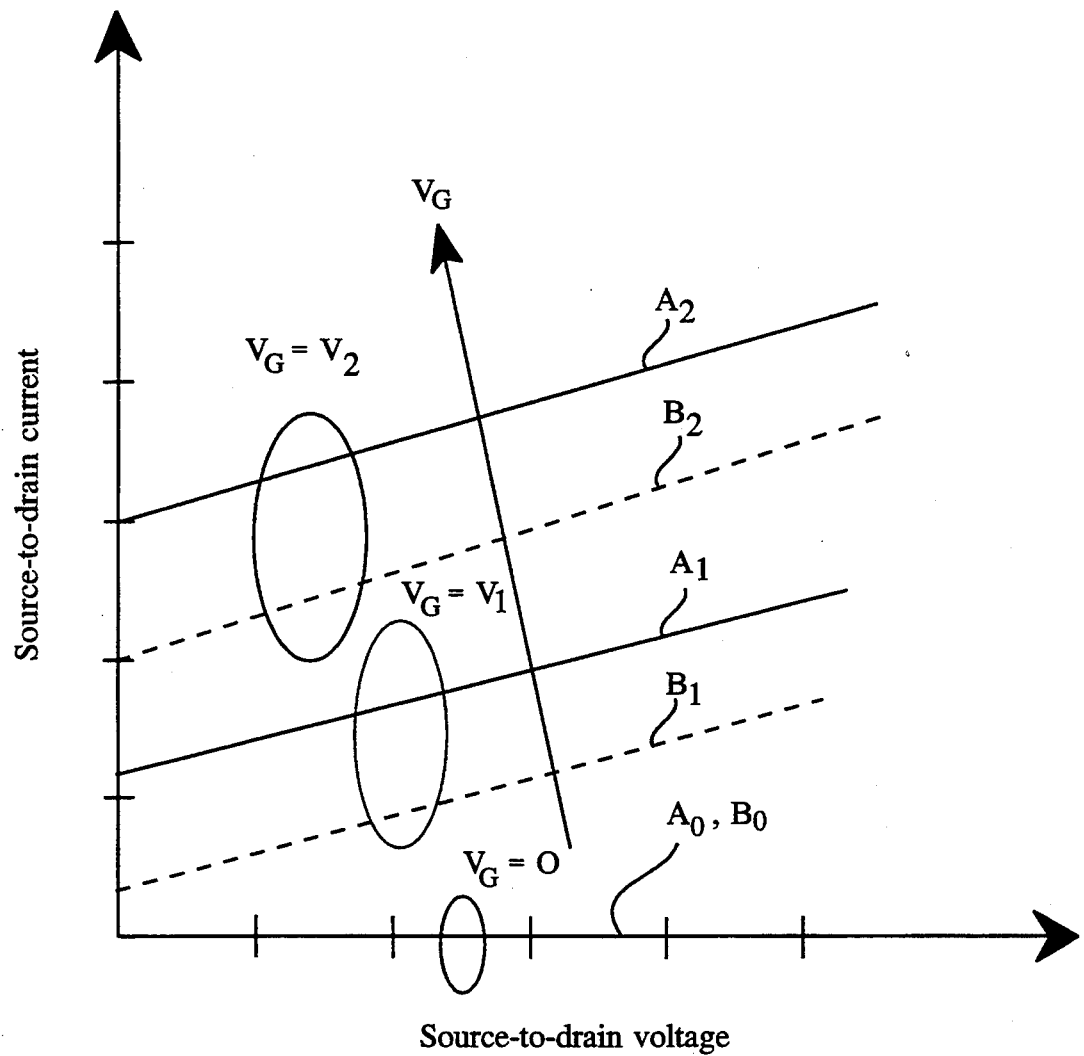
FIG. 2 is showing the current output characteristics of the superconducting transistor shown in FIG. 1.

FIG. 2 shows the relation between the source-to-drain voltage $V_{DS}$ associated with changes in the gate voltage $V_G$ and the source-to-drain current $I_{DS}$ in the superconducting transistor constructed as described above. In the figure, solid line A ($A_0$ to $A_2$) shows the current output characteristics of the superconducting transistor according to this embodiment, and the broken line B ($B_0$ to $B_2$) shows the current output characteristics of a conventional superconducting transistor (the superconducting transistor shown in FIG. 6) illustrated as a comparative example.

When no voltage is applied to the gate electrode 6 ($V_G=0$) and the source-to-drain voltage $V_{DS}$ is zero, no current flows between the source and the drain in the superconducting transistor as indicated by lines $A_0$ and $B_0$. When the gate voltage $V_G$ is raised while the source electrode 7 and the drain electrode 8 are being applied with a predetermined potential, the carriers injected from the source region 2a and the drain region 2b are stored at the interface of the barrier layer 3, where the source and the drain are linked, thereby allowing the source-to-drain current $I_{DS}$, or superconduction current to flow. This source-to-drain current $I_{DS}$ increases when the gate voltage $V_G$ applied to the gate electrode 6 is increased, and when a higher gate voltage $V_G$ is applied. Moreover, a higher output can be obtained as shown by the difference between solid line $A_1$ ($V_G=V_1$) and solid line $A_2$ ($V_G=V_2$) if the source-to-drain voltage $V_{DS}$ remains the same. If the gate voltage $V_G$ is the same, a higher output can be obtained with a higher source-to-drain voltage $V_{DS}$. When the characteristics of the superconducting transistor of this embodiment indicated by solid line A are compared with the characteristics of a conventional superconducting transistor indicated by broken line B, the figure shows that a large source-to-drain current $I_{DS}$ will flow in the superconducting transistor of this embodiment regardless of the size of the gate voltage $V_G$, and that a superconducting transistor with a high superconduction current density and excellent current output characteristics can be realized.

Thus, in the superconducting transistor of this embodiment, the electric field created by the gate voltage can be applied effectively on the interface of the barrier layer 3, and more carriers can be drawn out relative to the applied gate voltage. Therefore, since source and drain are linked smoothly by the carriers accumulated in the interface of the barrier layer 3, a larger superconduction current can be obtained than is possible in conventional superconducting transistors, and the output characteristics can be improved even if a gate voltage with the same intensity is applied. In addition, because the gap 4 between the source region 2a and drain region 2b is not filled with an insulation layer, it is not necessary to consider the bonding performance of the gap 4 (edges at the source region 2a and the drain region 2b) with a filling member (insulation layer), which means that the processing involved in forming the gap 4 can be simplified. In addition, in the superconducting transistor of this embodiment, the barrier layer 3, which is an intermediate region between the source region 2a and drain region 2b, uses a substance with a crystalline structure similar to that in YBCO (superconductor) to make up the source region 2a and drain region 2b, or PBCO, which removes restrictions attributable to the inherent properties of the substance to be eliminated in the distance between the source and the drain, making it possible to increase the distance between the source and the drain. Therefore, a withstand voltage which is far higher than that in conventional superconducting transistors can be obtained.

Figure 3:
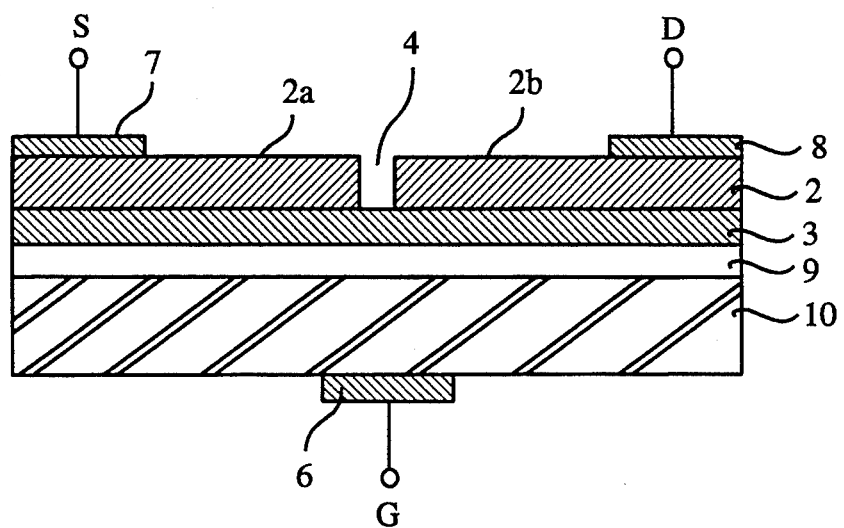
FIG. 3 is a cross section showing the structure of a superconducting transistor according to the second embodiment of the present invention.

FIG. 3 is a cross section showing the structure of a superconducting transistor according to the second embodiment of the present invention. In the superconducting transistor of this embodiment, the parts which correspond to those in the superconducting transistor shown in FIG. 1 are given the same numerals, and the explanations thereof are omitted.

This superconducting transistor is different from the superconducting transistor of the first embodiment in that the former transistor uses Nb-doped STO 100 as a substrate 10. In the superconducting transistor of this embodiment since the STO 100 turns into an n-type semiconductor and becomes electrically conductive as a result of doping with Nb, an STO film, which acts as an insulation layer 9 between the gate electrode 6 and the barrier layer 3, is formed on the substrate 10 by applying the sputtering process.

In the superconducting transistor with the configuration described above, the gate voltage applied to the gate electrode 6 is applied to the insulation layer 9 through the semiconductor substrate 10. Because this causes an electric field to be applied widely over the interface between the barrier layer 3 and the source region 2a and the interface between the barrier layer 3 and the drain region 2b, the source region 2a and the drain region 2b can be bonded smoothly. Therefore, the same results as those in the superconducting transistor of the first embodiment can be achieved. Since the above superconducting transistor differs from the superconducting transistor of the first embodiment shown in FIG. 1 in that no processing is required on the substrate to form a thinner wall, it is easier to fabricate the elements and productivity is improved. Moreover, it is possible to use the substrate 10 itself as a gate electrode.

Figure 4:
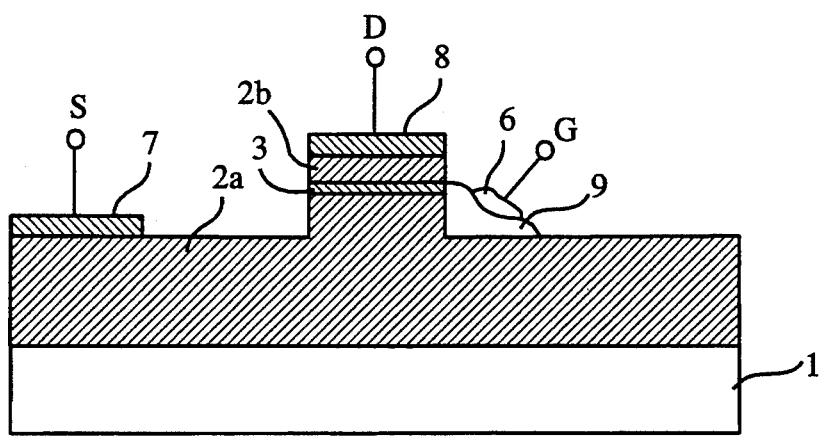
FIG. 4 is a cross section showing the structure of a superconducting transistor according to the third embodiment of the present invention.
Figure 5:
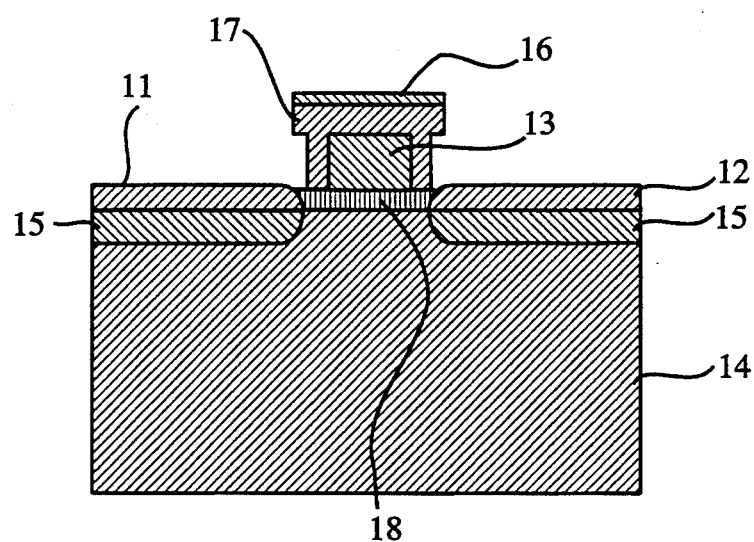
FIG. 5 is a cross section showing the structure of a conventional superconducting transistor.

FIG. 4 is a cross section showing the structure of a superconducting transistor according to the third embodiment of the present invention. In the superconducting transistor of this embodiment, the parts which correspond to those in the superconducting transistor shown in FIG. 1 are given the same numerals, and the explanations thereof are omitted.

This superconducting transistor is different from the superconducting transistor of the first embodiment in that the former transistor has a laminar structure such that the source region 2a and the drain region 2b are laminated with the barrier layer 3 sandwiched between them on a STO substrate 1. That is, on the STO substrate 1 the superconducting transistor of this embodiment has a YBCO film which is used as the source region 2a, a PBCO film which is used as the barrier layer 3, and a YBCO film which is used as the drain region 2b in that order, all created by applying a sputtering process. After patterning, an ion-milling machine is used to remove predetermined areas of each film so that a device cross section will have a convex shape. Thereafter, an STO film is formed by applying a sputtering process to the part where the sides of each film in the source region 2a, barrier layer 3, and drain region 2b are exposed, to form an insulation layer 9, on which Au is deposited to form the gate electrode 6.

In the superconducting transistor with the configuration described above, an electric field due to the gate voltage is applied approximately uniformly over the side spanning the source region 2a, barrier layer 3, and drain region 2b. This causes the carriers that ooze out from the source region 2a and the drain region 2b into the barrier layer 3 to be drawn out onto an interface where the electric field created by the gate voltage, thereby allowing the source drain 2a and the drain region 2b to be bonded. Thus, because the carriers can be drawn out effectively in accordance with the applied gate voltage in the superconducting transistor of this embodiment in a similar manner as in the superconducting transistors of the first and second embodiments, it is possible to increase the superconduction current between the source and the drain. In addition, since the superconducting transistor of this embodiment has a laminar structure such that the source region 2a and the drain region 2b sandwich the barrier layer 3, it is possible to control closely the gap width from the source region 2a and the drain region 2b, and the thickness of the barrier layer 3. Furthermore, because the source region 2a can be bonded with the barrier layer 3 and the barrier layer 3 can be bonded with the drain region 2b satisfactorily, the reproducibility of this high-performance superconducting transistor can be improved.

Although $YBa_2Cu_3O_{7-x}$ has been used in the first three embodiments as an oxide superconductor, other materials can also be used with the La—Sr—Cu—O group, Ln—Ba—Cu—O (Ln=La, Nd, Sm, Eu, Gd, Tb, Dy, Ho, Er, Tm, Yb, Lu) group, Bi—Sr—Ca—Cu—O group, and Tl—Ba—Cu—O group. For example, $PrBa_2Cu_3O_{7-x}$ as well as $ScBa_2Cu_3O_{7-x}$ can be used with an Ln—Ba—Cu—O (Ln=La, Nd, Sm, Eu, Gd, Dy, Ho, Er, Tm, Yb, Lu) group superconductor. In addition, $Y_{1-x}Pr_xBa_2Cu_3O_y$ (x=0.6 to 1.0) may be used as a barrier layer for the $YBa_2Cu_3O_{7-x}$ superconductor (y>6.5), and $Bi_2Sr_2Cu_2Ox$ or $Bi_2Sr_2Ca_{1-y}YyCu_2O_x$ (y=0.5 to 1.0) may be used as a barrier layer for $Bi_2Sr_2CaCu_2O_x$ of the Bi—Sr—Ca—Cu—O group. Furthermore, CaBaCu$_2$Ox may be used as a barrier layer for the Tl—Ba—Cu—O group superconductor, and La$_2$CuO$_4$ may be used as a barrier layer for La$_{2-x}$Ba$_x$CuO$_4$ of the La—Ba—Cu—O group and for La$_{2-x}$Sr$_x$CuO$_4$ of the La—Sr—Cu—O system.

As described above, the superconducting device according to the present invention is characterized in that a source region and a drain region are formed on the upper part of a barrier layer, while a gate electrode is formed on the lower part of the barrier layer. Therefore, because an electric field due to the gate voltage can be applied uniformly and effectively to the interface of the barrier layer, it is possible to apply an electric field corresponding to the gate voltage to the interface of the barrier layer, as well as to store carriers uniformly in an interface of the barrier layer in the area from the source region to the drain region. Therefore, a small gate voltage can be used to connect a source to a drain, thereby making possible to obtain a good current output with a diminished voltage loss.

In addition, the present invention is characterized in that it has a laminar structure such that a source region and a drain region sandwich a barrier layer, and that a gate electrode is disposed on one side spanning the source region, the barrier layer, and the drain region via an insulation layer.

These characteristics allow the electric field on the side spanning the source region, the barrier layer, and the drain region to be increased in accordance with the gate voltage, thereby making it possible to draw out and accumulate more carriers. Therefore, a larger source-to-drain current than in the conventional devices can be obtained when the same gate voltage is used, and as a result, the current output characteristics can be improved.

What is claimed:

1. A superconducting device comprising:
   a source region and a drain region each comprised of an oxide superconductor;
   a barrier layer having a crystalline structure similar to that of said oxide superconductor, said barrier layer having upper and lower opposite major surfaces, said source and drain regions being formed on said upper surface of said barrier layer; and
   a gate electrode spanning over said source region and said drain region, said gate electrode being capable of applying an electric field to said barrier layer, wherein said gate electrode is formed below the lower surface of said barrier layer, and an insulation layer is interposed between said gate electrode and said barrier layer wherein said barrier layer is non-superconducting when a gate voltage is not applied to the gate electrode.

2. The superconducting device of claim 1, wherein said insulation layer is an insulating substrate, said insulating substrate having an area of reduced thickness spanning over said source and drain regions, said gate electrode being formed on said area of reduced thickness.

3. The superconducting device of claim 1, further comprising a semiconductor substrate interposed between said insulation layer and said gate electrode.

4. A superconducting device as claimed in claim 1, wherein the barrier layer comprises Pr—Ba—Cu—O.

5. A superconducting device comprising:
   a source region and a drain region each comprised of an oxide superconductor;
   a barrier layer having a crystalline structure similar to that of said oxide superconductor, said barrier layer being interposed between said source and drain regions so as to form a laminar structure, wherein said laminar structure includes a side face; and
   a gate electrode formed over said side face of said laminar structure, wherein said gate electrode extends over side faces of said source region, said barrier layer and said drain region which comprise said side face of said laminar structure wherein said barrier layer is non-superconducting when a gate voltage is not applied to the gate electrode.

6. The superconducting device of claim 5, further comprising an insulating layer on which said laminar structure is disposed.

7. A superconducting device as claimed in claim 5, wherein the barrier layer comprises Pr—Ba—Cu—O.

8. A superconducting device as claimed in claim 5, further comprising an insulating layer located between said gate electrode and said side face.

* * * * *